United States Patent
Park et al.

(10) Patent No.: US 8,426,229 B2
(45) Date of Patent: Apr. 23, 2013

(54) METHOD OF FABRICATING LIQUID CRYSTAL DISPLAY DEVICE

(75) Inventors: Seung Ryull Park, Goyang-si (KR); Kyung Mo Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 245 days.

(21) Appl. No.: 12/849,489

(22) Filed: Aug. 3, 2010

(65) Prior Publication Data

US 2011/0136277 A1    Jun. 9, 2011

(51) Int. Cl.
*H01L 21/00* (2006.01)

(52) U.S. Cl.
USPC ............. 438/34; 257/E21.414; 257/57

(58) Field of Classification Search ............. 438/34, 438/E21.414; 257/57, 59, 72, 83, 257, 290, 257/351, 368, 392
See application file for complete search history.

(56) References Cited

U.S. PATENT DOCUMENTS

2007/0263132 A1\* 11/2007 Yang ............................. 349/43
2010/0015738 A1\*  1/2010 Kim ............................. 438/26

\* cited by examiner

*Primary Examiner* — Tony Tran
(74) *Attorney, Agent, or Firm* — McKenna Long & Aldridge, LLP

(57) ABSTRACT

Disclosed is a method of fabricating a LCD device that includes forming sacrifice layer patterns in a pixel region while forming a gate line, a first storage electrode, and a gate pad on a substrate; sequentially forming a gate insulation film, an amorphous silicon film, an impurity-doped amorphous silicon film, and a source/drain metal film on a substrate, forming a transparent conductive material on the substrate covered with a protection and then patterning the transparent conductive material to form a second storage electrode overlapping the first storage electrode and an electrode pattern having a part overlapping an area of one side edge of the sacrifice layer patterns and the other part formed on the substrate; and simultaneously forming a common electrode and a pixel electrode in the pixel region by performing a lift-off process to remove the sacrifice layer patterns on the substrate where the electrode pattern is formed.

4 Claims, 13 Drawing Sheets

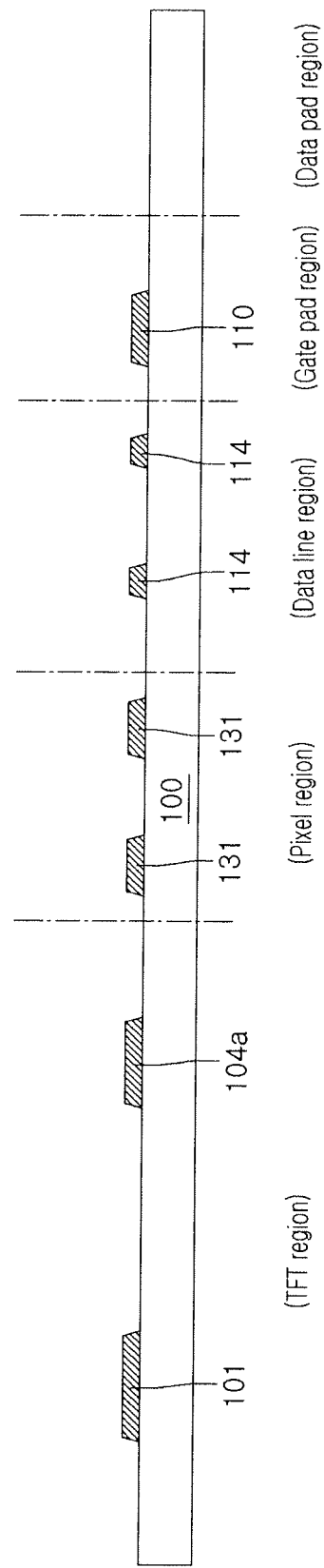

METHOD OF FABRICATING LIQUID CRYSTAL DISPLAY DEVICE

CROSS-REFERENCE TO RELATED APPLICATION

This application claims priority under 35 U.S.C. 119 to Korean Patent Application No. 10-2009-0120753, filed on Dec. 7, 2009, which is hereby incorporated by reference in its entirety.

BACKGROUND

1. Field of the Disclosure

This disclosure relates to a method of fabricating a liquid crystal display (LCD) device.

2. Description of the Related Art

Liquid crystal display (LCD) devices have gradually attracted wide attention, as a replacement that can overcome drawbacks of cathode ray tubes (CRTs), because of its advantages such as compact size, light weight, and low power consumption. Recently, LCD devices are employed in nearly all information processing apparatuses needing display devices.

The LCD device uses modulation of light by liquid crystal cells, that is, by applying a voltage to a specific molecule arrangement of liquid crystal, the molecule arrangement is converted to other molecule arrangement so that a change of optical properties is converted to a visual change.

The LCD device is fabricated by a various processes including manufacturing upper and lower substrates of a panel, which is accompanied by a process of forming liquid cells that forms a pixel unit, forming and rubbing an orientation film for liquid crystal orientation, adhesively combining the upper and lower substrates, and injecting liquid crystal between the adhesively combined upper and lower substrates and sealing the upper and lower substrates.

In the lower substrate manufacturing process, a unit pixel region is defined by arranging a plurality of gate lines and data lines to cross each other. A thin film transistor (TFT) that is a switching element and a pixel electrode are formed in each pixel region. The TFT is turned on by a driving signal supplied through the gate line and performs a switching function to provide a graphic signal that is supplied through the data line, to a pixel electrode. The graphic signal provided to the pixel electrode generates an electric field to rotate liquid crystal and thus converts external or internal light to display an image.

In particular, as the LCD device becomes large and high resolution, technology to provide the pixel region with a high aperture ratio and a high transmittance has been developed. For the LCD device to have a high aperture ratio and a high transmittance, the width of each of the gate line, the data line, the pixel electrode, and a common electrode arranged within a predetermined pixel region is formed to be narrow.

However, it is difficult to reduce the width of a line or electrode that is patterned, to be not greater than 4 μm, due to the physical properties of an exposure equipment used in a method of fabricating an LCD device. That is, the width of a line or electrode that can be formed through the processes of forming a metal film on a substrate, coating a photoresist film, performing a mask process, and performing exposure, development, and etching processes, is greater than 4 μm.

The width of a line or electrode may not be further decreased due to the limit in the resolutions of a mask and an exposure equipment used in the LCD device fabrication process. Thus, it is difficult to form the width of a line or electrode formed on an array substrate of an LCD device, to be not greater than 4 μm, by using a currently used equipment.

Thus, an LCD device having higher aperture ratio and transmittance may not be fabricated unless the width of a line or electrode formed in a pixel region of the LCD device to be not greater than 4 μm.

BRIEF SUMMARY

Accordingly, the present embodiments are directed to an LCD device that substantially obviates one or more of problems due to the limitations and disadvantages of the related art.

Accordingly, the present embodiments are directed to a method of fabricating an LCD device, by which a line and an electrode having a width much narrower than the physical resolution of an exposure equipment may be formed by using a mask and an exposure equipment used in a conventional process of fabricating an LCD device.

In particular, the present disclosure is directed to a method of fabricating an LCD device, by which a pixel aperture ratio and transmittance are improved by forming the width of each of a signal line and an electrode formed in a pixel region of the LCD device, in a fine pattern.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a method of fabricating a liquid crystal display device includes: forming a plurality of sacrifice layer patterns in a pixel region while forming a gate line, a first storage electrode, and a gate pad on a substrate; sequentially forming a gate insulation film, an active layer consisting of an amorphous silicon film, an impurity-doped amorphous silicon film, and a source/drain metal film on a substrate provided with the gate line, and then forming a source/drain electrode, an active layer, and a data line; forming a protection film on an entire surface of the substrate loaded with the source/drain electrode, and then forming contact holes in the protection film; forming a transparent conductive material on the substrate covered with the protection film and then patterning the transparent conductive material, to form a second storage electrode to overlap the first storage electrode and an electrode pattern having a part overlapping an area of one side edge of the sacrifice layer patterns and the other part formed on the substrate; and simultaneously forming a common electrode and a pixel electrode in the pixel region by performing a lift-off process to remove the sacrifice layer patterns on the substrate where the electrode pattern is formed.

According to another general aspect of the present embodiment, a method of fabricating a liquid crystal display device includes: forming a plurality of sacrifice layer patterns in a pixel region while forming a gate line, a first storage electrode, and a gate pad on a substrate; sequentially forming a gate insulation film, an active layer consisting of an amorphous silicon film and an impurity-doped amorphous silicon film, and a source/drain metal film on a substrate provided with the gate line, and then forming a source/drain electrode, an active layer, and a data line; forming a protection film on an entire surface of the substrate loaded with the source/drain electrode, and then forming contact holes in the protection film; forming a transparent conductive material on the substrate covered with the protection film and then patterning the transparent conductive material, to form a second storage electrode to overlap the first storage electrode and an electrode pattern having a part overlapping the sacrifice layer patterns in an area of both side edges of the sacrifice layer patterns and the other part formed on the substrate, to be symmetrical to each other; and simultaneously forming a common electrode and a pixel electrode in the pixel region by performing a lift-off process to remove the sacrifice layer patterns on the substrate where the electrode pattern is formed.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings:

FIGS. 3A-3E are cross-section views illustrating a process of fabricating an LCD device according to another embodiment of the present disclosure.

DETAILED DESCRIPTION

Figure 1:
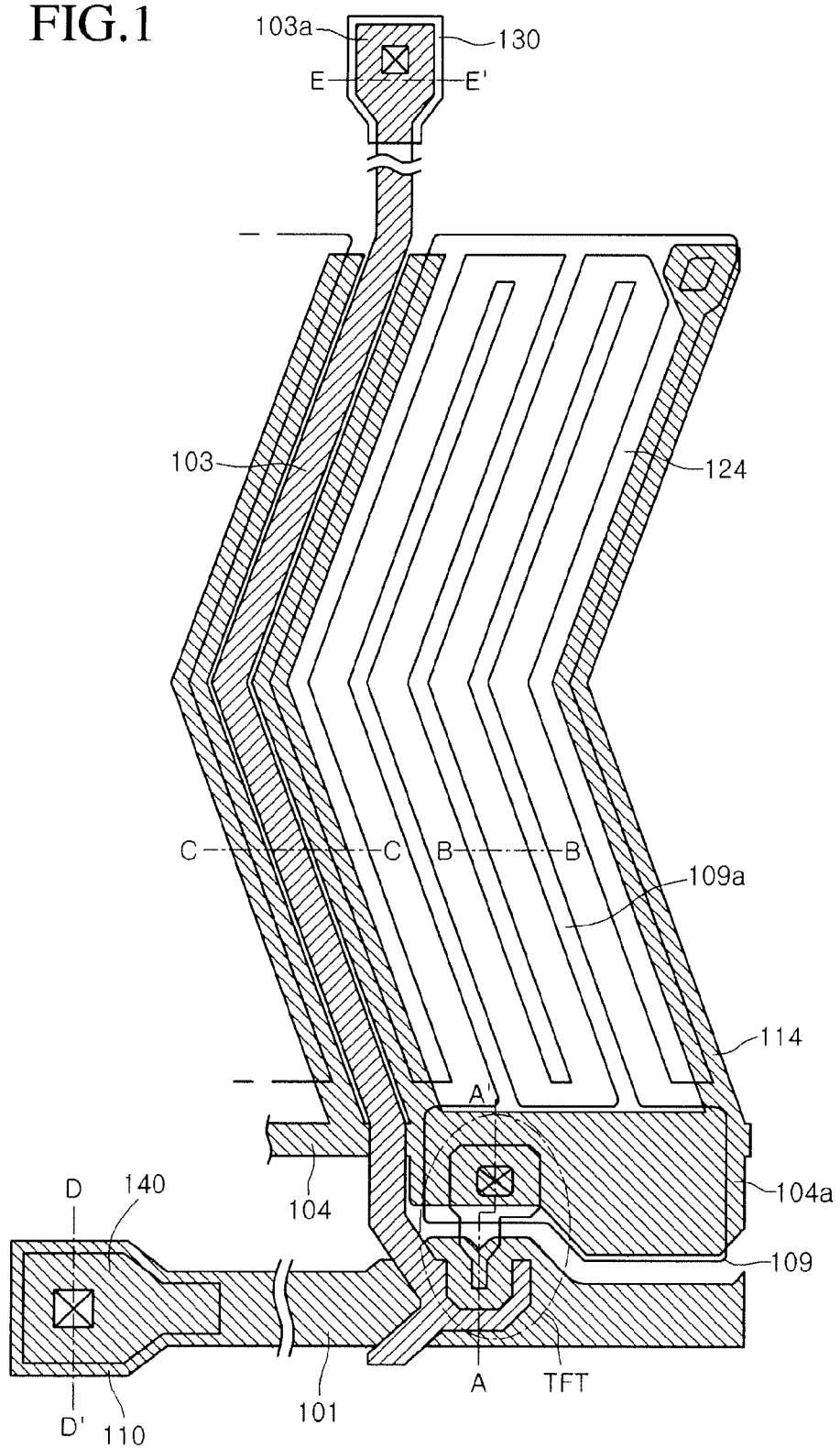
FIG. 1 is a plan view illustrating the structure of a pixel of an LCD device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIG. 1 is a plan view illustrating the structure of a pixel of an LCD device according to an embodiment of the present disclosure. Referring to FIG. 1, a unit pixel region is defined as a gate line 101 and a data line 103 cross each other. A thin film transistor (TFT) that is a switching element is arranged in the crossing area.

In the unit pixel region, a common line 104 is arranged parallel to the gate line 101 in an area close to the gate line 101. The common line 104 is arranged to cross the data line 103. A first common electrode 114 is branched from the common line 104 along the both side edges of the unit pixel region. That is, the common line 104 and the first common electrode 114 are integrally formed. Also, the first common electrode 114 is formed in the pixel region in a direction parallel to the data line 103.

The common line 104 located close to the gate line 101 is formed to have a wider width than that of the common line 104 in the unit pixel region, which is to form a first storage electrode 104a of a storage capacity (not shown).

A second storage electrode 109 is formed above the first storage electrode 104a to overlap the first storage electrode 104a. The second storage electrode 109 is formed of the same transparent conductive material as a plurality of pixel electrodes 109a. That is, the pixel electrode 109a and the second storage electrode 109 are integrally formed.

In the unit pixel region, the pixel electrodes 109a branched from the second storage electrode 109 are formed parallel to the data line 103. A plurality of second common electrodes 124 are formed in the unit pixel region alternately with the pixel electrodes 109a. The second common electrodes 124 are formed of the same transparent conductive material as that used for the pixel electrodes 109a.

Also, the second common electrodes 124 electrically contact the first common electrode 114 that is branched from the common line 104 and are formed in the unit pixel region to be parallel to the pixel electrodes 109a and the data line 103.

A drain electrode of the TFT electrically contacts the second storage electrode 109 and applies a data signal supplied through the data line 103, to the pixel electrodes 109a. Likewise, a common voltage supplied through the common line 104 is applied to the second common electrode 124 through the first common electrode 114.

A gate pad 110 is formed on one end of the gate line 101. A gate contact pad portion 140 that is patterned of the same transparent conductive material as that used for the pixel electrodes 109a is formed on the gate pad 110. Also, a data pad 103a is formed at one edge of the data line 103. A data contact pad portion 130 that is patterned of the same transparent conductive material as that used for the pixel electrodes 109a is formed on the data pad 103a.

In the present disclosure, the widths of the respective lines and electrodes are formed to be narrow such that the unit pixel region of the LCD device has properties of a high aperture ratio and a high transmittance. Thus, the width of each of the common electrode and the pixel electrode arranged in the unit pixel region is 3.5 μm or less. Since the widths of the common electrode and the pixel electrode are formed to be narrow, the distance between the electrodes arranged in the pixel region is relatively increased so that the aperture ratio and transmittance properties are improved.

The process of fabricating a fine pattern according to the present disclosure will be described in detail with reference to FIGS. 2A-2E and 3A-3E. FIGS. 2A-2E are cross-section views illustrating a process of fabricating an LCD device according to an embodiment of the present disclosure.

Referring to FIGS. 2A-2E, after forming a metal film on a substrate 100, a gate electrode and the gate line 101 are formed in a TFT region A-A' according to a photolithography process. The first storage electrode 104a is formed in an area close to the gate line 101. A plurality of sacrifice layer patterns 131 are formed in the unit pixel region (B-B'). Also, the first common electrode 114 branched from a common line (not shown) and formed in the areas of the both side edges of the unit pixel region is formed in an area where a data line is to be formed (C-C'). The gate pad 110 integrally formed with the gate line 101 is formed in a pad region (D-D').

The gate electrode, the gate line 101, the first storage electrode 104a, the common line, the first common electrode 114, the gate pad 110, and the sacrifice layer patterns 131 may be formed of a single metal layer of copper (Cu), aluminum (Al), molybdenum (Mo), or chromium (Cr) having a high conductivity or, in some cases, may be formed in at least one deposition layer or an alloy form.

The sacrifice layer pattern 131 is left to form the width of each of the pixel electrode and the second common electrode to be 3.5 μm or less when the pixel electrode and the second common electrode are patterned in a subsequent lift-off process.

Figure 2A:
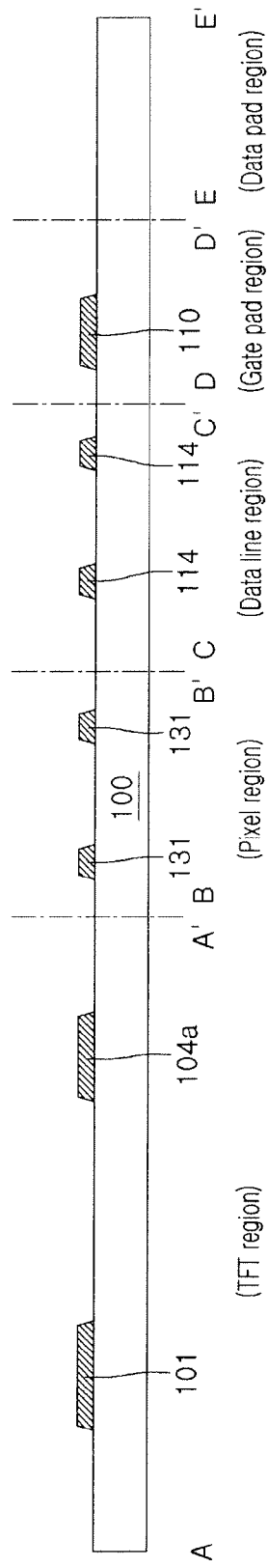
FIGS. 2A-2E are cross-section views illustrating a process of fabricating an LCD device according to an embodiment of the present disclosure.
Figure 2B:
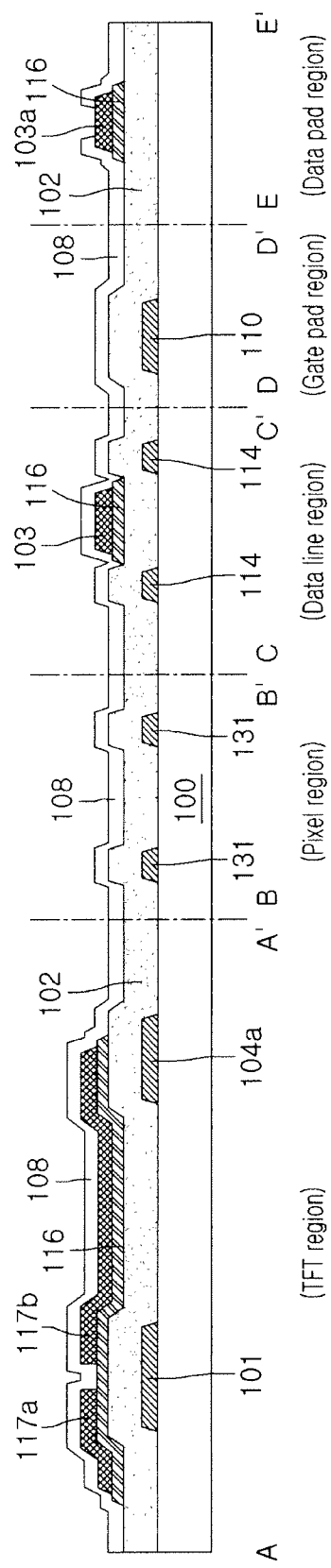

In a first mask process for forming the gate line 101 and so on, exposure and development processes are performed according to a generally used mask process and then an etch process is performed. Then, when the gate line 101 is formed on the substrate 100, as illustrated in FIG. 2B, a gate insulation film 102, an active layer 116 formed of an amorphous silicon film and an amorphous silicon film doped in a P+ or N+ type, and a metal layer for forming source/drain electrodes are continuously formed on the entire surface of the substrate 100.

When the gate insulation film 102, the active layer 116 including an amorphous silicon film and an impurity-doped amorphous silicon film, and the metal layer are formed on the substrate 100 as above, a second mask process is performed so that the active layer 116 and source/drain electrodes 117a and 117b are formed on the gate line 101 in the TFT region.

The data line 103 is formed at a boundary between the unit pixel regions where the first common electrode 114 is formed. The data pad 103a is formed in a data pad region E-E'.

In the second mask process, the active layer 116, the source/drain electrodes 117a and 117b, the data line 103, and the data pad 103a are simultaneously formed by using a photosensitive film pattern that is obtained by a one-time mask process using a diffraction mask or a half-tone mask. Since the active layer 116 and the source/drain electrodes 117a and 117b are simultaneously formed in the second mask process, the source/drain electrodes 117a and 117b, the data line 103, and the data pad 103a are formed on the active layer 116.

Also, since the source/drain electrodes 117a and 117b, the data line 103, and the data pad 103a formed on the active layer 116 are formed according to a diffraction mask or half-tone mask process, the source/drain electrodes 117a and 117b, the data line 103, and the data pad 103a each have a width narrower than that of the active layer 116 formed thereunder. When the source/drain electrodes 117a and 117b and the data line 103 are formed on the substrate 100, a protection film 108 is formed on the entire surface of the substrate 100.

Figure 2C:
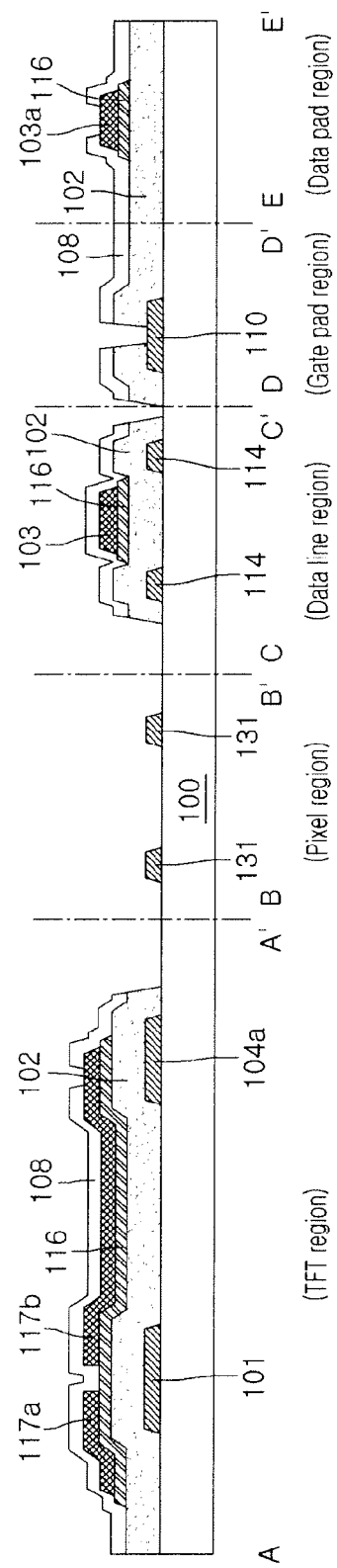
Figure 2D:
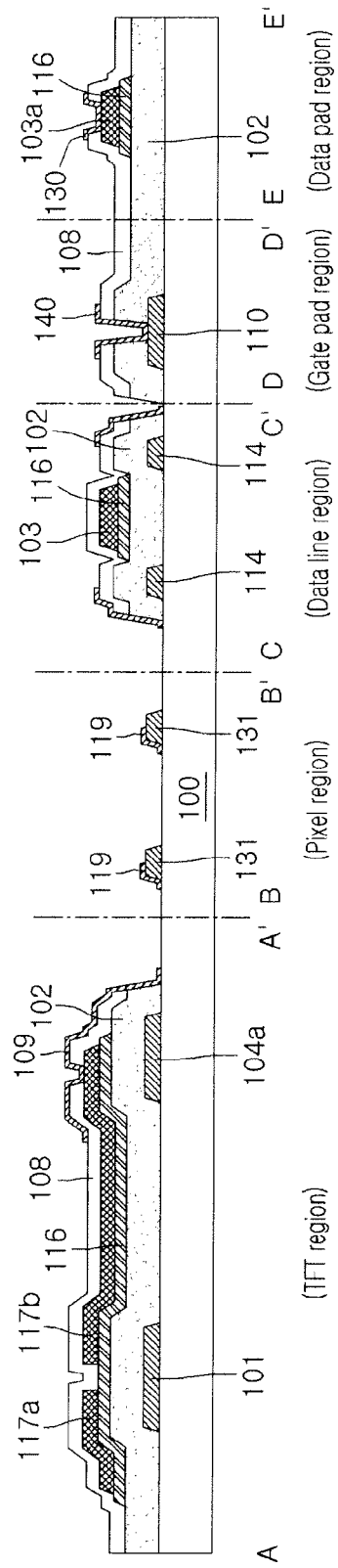

When the protection film 108 is formed on the source/drain electrodes 117a and 117b, the data line 103, and the data pad 103a, as illustrated in FIGS. 2C and 2D, a third mask process and a fourth mask process are performed, so that contact holes each exposing the drain electrode 117b within the TFT region, the gate pad 110, and the data pad 103a are formed. Subsequently, the second storage electrode 109, the gate contact pad portion 140, and the data contact pad 130 are formed.

In a process of forming a contact hole for removing the protection film 108, the protection film 108 and the gate insulation film 102 are all removed from the unit pixel region, in order to expose the substrate 100 and the sacrifice layer pattern 131.

In the unit pixel region B-B', an electrode pattern 119 is formed to overlap only a side edge area of one side of the sacrifice layer pattern 131 to subsequently form the pixel electrode and the second common electrode in a fine pattern type.

The electrode pattern 119 partially overlaps only the side edge area of one side of the sacrifice layer pattern 131 while the other part is patterned to be formed on the substrate 100. That is, when the contact holes are formed by performing the third mask process on the protection film 108, a transparent conductive material is deposited and then the fourth mask process is performed, so as to form the second storage electrode 109, the gate contact pad portion 140, the data contact pad portion 103a, and the second common electrode 124 which is positioned only at the side edge area of the unit pixel region. Thus, without the second common electrode and the pixel electrode, only the electrode pattern 119 is formed in the central area of the unit pixel region.

Figure 2E:
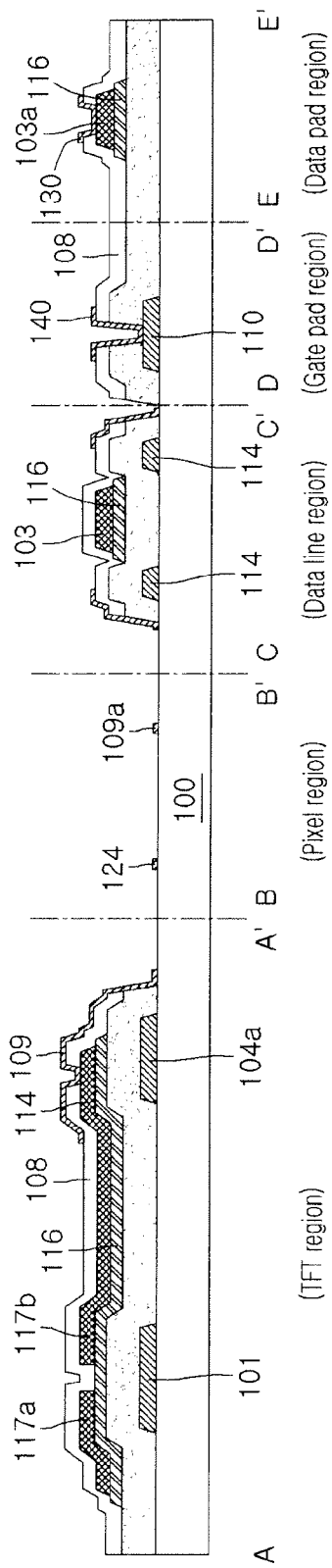

Then, a lift-off process to remove only the sacrifice layer pattern 131 is performed. FIG. 2E illustrates a process of forming the pixel electrode and the common electrode by lift-off. An etchant having different etch ratios for the sacrifice layer pattern 131 formed of the same material as the gate line 101 and for the electrode pattern formed of a transparent insulation material is used to perform the lift-off process.

Thus, while the sacrifice layer pattern 131 is removed by the lift-off process, the part of the electrode pattern 119 overlapping the sacrifice layer pattern 131 is removed together. However, the electrode pattern 119 formed on the substrate 100 not to overlap the sacrifice layer pattern 131 remains.

Referring to FIG. 2E, it can be seen that the sacrifice layer pattern 131 is removed by the lift-off process and the second common electrode 124 and the pixel electrode 109a are left in the unit pixel region.

The width of each of the second common electrode 124 and the pixel electrode 109a is much narrower than the width of the electrode pattern formed by the resolution of an exposure equipment. This is because the part of the electrode pattern 119 overlapping the side edge area of the side of the sacrifice layer pattern 131 is removed so that the portion that becomes the second common electrode 124 and the pixel electrode 109a remaining on the substrate 100 is narrower than the width of the electrode pattern 119 in the previous stage. For example, when the width of the electrode pattern formed by the exposure equipment used in the fourth mask process is 4 μm, the width of each of the second common electrode 124 and the pixel electrode 109a formed by the lift-off process is less than a width that is ½ or ⅓ of the width of the electrode pattern.

Thus, when the width of each of the common electrode and the pixel electrode of a conventional LCD device is 4 μm at its minimum, in the present disclosure, the width of each of the common electrode and the pixel electrode may be formed to be 2 μm or 1 μm or less. Therefore, the area on the substrate taken by the common electrode and the pixel electrode formed in the unit pixel region decreases so that a high aperture ratio and a high transmittance may be obtained.

FIGS. 3A-3E are cross-section views illustrating a process of fabricating an LCD device according to another embodiment of the present disclosure. The present embodiment illustrated in FIGS. 3A-3E is to form more number of common electrodes and pixel electrodes within a unit pixel region based on the pixel structure of FIG. 1. Accordingly, although FIGS. 3A-3E are cross-sectional views based on the pixel structure of FIG. 1 in terms of structure, the formation process of the second common electrode and the pixel electrode formed in the unit pixel region is different from that of the above-described embodiment. Thus, the constituent elements of FIGS. 3A-3E having the same references as those in FIGS.

2A-2E denote the same constituent elements. The detailed formation process of the constituent elements referred in the above-described embodiment will be based on the descriptions of FIGS. 2A-2E, and only different portions will be mainly discussed below.

Referring to FIGS. 3A-3E, a metal film is formed on the substrate 100 that is divided into the TFT region, the pixel region, the data line region, the gate pad region, and the data pad region, and the first mask process is performed. Those conductive metals described in FIG. 2A are used as the metal film.

The gate line 101 working as a gate electrode and a gate signal line, the first storage electrode 104a, a plurality of sacrifice layer patterns 131 in the pixel region, the first common electrode 114 branched from a common line (not shown) in the data line region, and the gate pad 110 integrally formed with the gate line 101 in the gate pad region are formed on the substrate 100.

Then, as illustrated in FIG. 2B, the gate insulation film 102, the active layer 116 formed of an amorphous silicon film and an amorphous silicon film doped in a P+ or N+ type, and the metal layer for forming source/drain electrodes are continuously formed on the entire surface of the substrate 100. Thereafter, a TFT formed of the active layer 116 and the source/drain electrodes 117a and 117b is formed on the gate line 101 in the TFT region by using a diffraction mask or a half-tone mask.

The data line 103 is formed in the area where the first common electrode 114 is formed that is branched to the both side edges of the pixel region from the common electrode. The data pad 103a is formed in the data pad region.

Figure 3B:
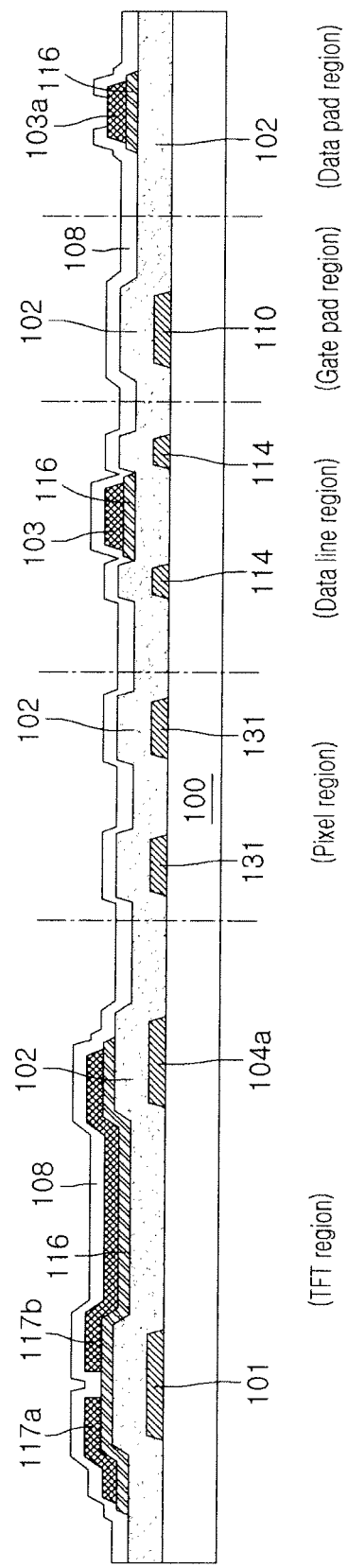
Figure 3C:
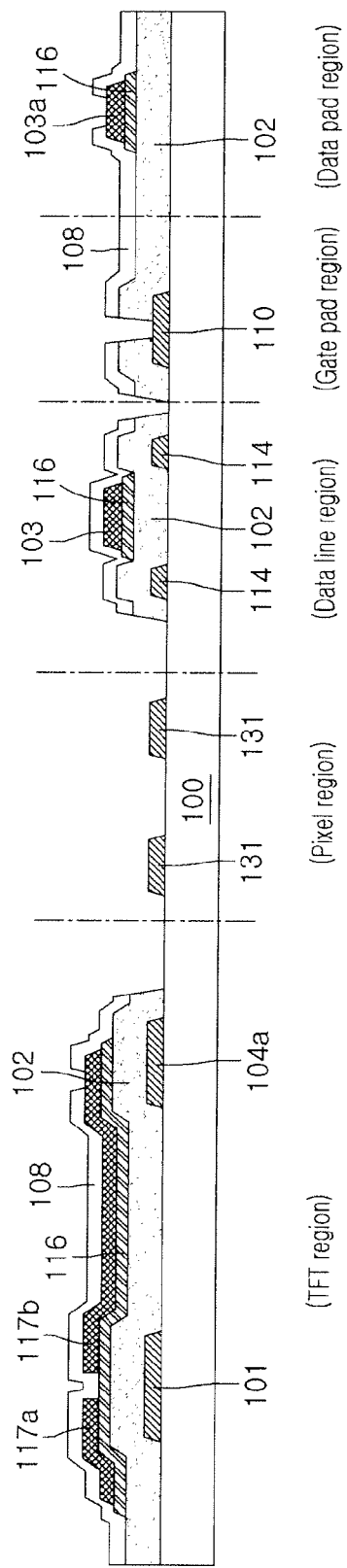

The protection film 108 is formed on the entire surface of the substrate 100. As illustrated in FIG. 3C, a contact hole forming process is performed to expose a part of the drain electrode 117b that overlaps the first storage electrode 104a. The gate pad 110 and the data pad 103a are exposed in the pad region, and the sacrifice layer pattern 131 is exposed in the pixel region.

Figure 3D:
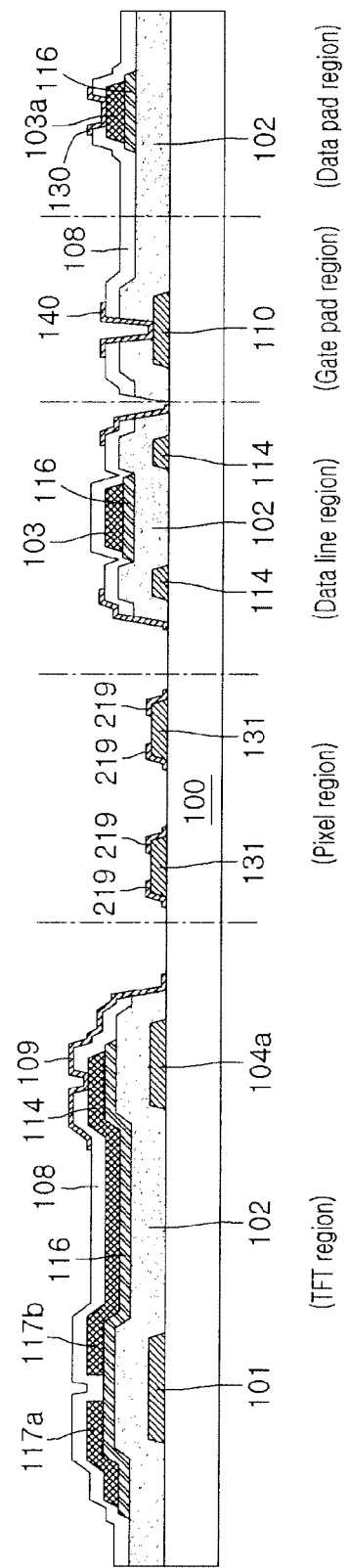

When the sacrifice layer pattern 131 formed on the substrate 100 is exposed, as illustrated in FIG. 3D, a transparent conductive material is formed on the entire surface of the substrate 100 and the mask process is performed so that its second storage electrode 109 electrically contacting the drain electrode 117b, the gate contact pad portion 140, the data contact pad portion 130, and the second common electrode 124 formed in the side edge are of the unit pixel region. An electrode pattern 219 is formed in the areas of the both side edges of the sacrifice layer pattern 131 formed on the substrate 100.

The electrode pattern 219 is formed to correspond to the both side edges of the sacrifice layer pattern 131, unlike the above-described embodiment. The electrode pattern 219 is deposited to partially overlap the side edge of the sacrifice layer pattern 131, whereas the other part of the electrode pattern 219 is formed on the substrate 100.

That is, only a part of the electrode pattern 219 is formed on the sacrifice layer pattern 131 and the other part thereof is formed on the substrate 100. Also, the electrode pattern 219 is formed symmetrically to the both side edges of the sacrifice layer pattern 131 with respect to the center of the sacrifice layer pattern 131.

Figure 3E:
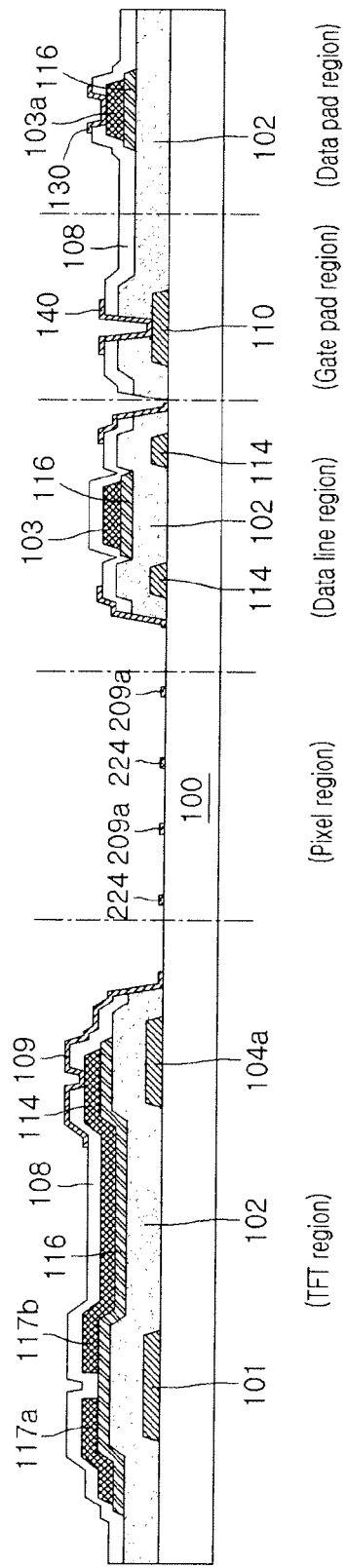

Then, a lift-off process to remove only the sacrifice layer pattern 131 is performed. FIG. 3E illustrates a process of forming the pixel electrode and the common electrode by lift-off.

Referring to FIGS. 3D and 3E, an etchant having different etch ratios for the sacrifice layer pattern 131 formed of the same material as the gate line 101 and for the electrode pattern 219 formed of a transparent insulation material is used to perform the lift-off process.

Thus, while the sacrifice layer pattern 131 is removed by the lift-off process, the part of the electrode pattern 219 overlapping the sacrifice layer pattern 131 is removed together. However, the electrode pattern 219 formed on the substrate 100 not to overlap the sacrifice layer pattern 131 remains.

Unlike FIG. 2E, in the present embodiment, the electrode pattern 219 is formed at both sides of the sacrifice layer pattern 131 so that two electrodes may be formed with respect to a single sacrifice layer pattern.

That is, in the present disclosure, since the width of a line or electrode can be formed to be much narrower than that of a conventional technology, more number of electrodes may be formed in the pixel region. In the present embodiment, since the electrodes are formed in a fine pattern, even when more number of electrodes are formed in the pixel region compared to the conventional technology, an electric field characteristic may be improved without deteriorating an aperture ratio.

Also, when the electrode pattern 119 is misaligned in the sacrifice layer pattern 131, the distance between the common electrode and the pixel electrode is constantly separated as far as the width of the sacrifice layer pattern 131 so that a brightness defect may be prevented.

Thus, as the electrode pattern 119 overlapping the sacrifice layer pattern 131 is removed, the second common electrode 224 and the pixel electrode 209a are formed in the pixel region of the substrate 100 by maintaining a constant distance therebetween.

The width of each of the second common electrode 224 and the pixel electrode 209a formed in the pixel region has a fine electrode width much narrower than the width of the electrode pattern 119. For example, when the width of an electrode pattern formed by using the exposure equipment used in the mask process is 4 μm, the width of each of the second common electrode 224 and the pixel electrode 209a formed by the lift-off process is less than a width that is ½ or ⅓ of the width of the electrode pattern.

Thus, when the width of each of the common electrode and the pixel electrode of the conventional LCD device is 4 μm at its minimum, in the present disclosure, the width of each of the common electrode and the pixel electrode may be formed to be 2 μm or 1 μm or less. Therefore, the area on the substrate taken by the common electrode and the pixel electrode formed in the unit pixel region decreases so that a high aperture ratio and a high transmittance may be obtained.

Also, even when the second common electrode 24 and the pixel electrode 209a have different widths due to misalignment during a process, the distance between the second common electrode 24 and pixel electrode 209a, which corresponds to the width of the sacrifice layer pattern 131, can be maintained. Therefore, a brightness irregularity phenomenon can be prevented.

Figure 4A:
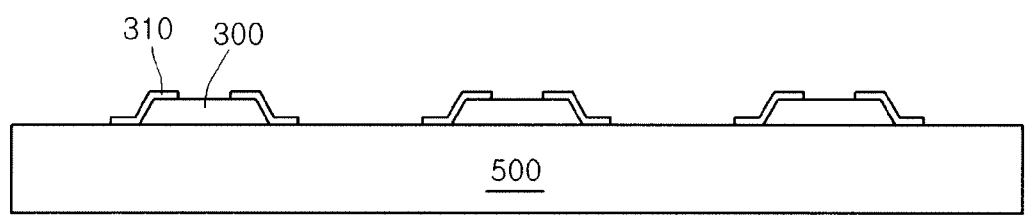
FIGS. 4A-4C are cross-section views for explaining a state in which electrodes formed according to the embodiment of FIGS. 3A-3E are maintained at a constant interval.
Figure 4A:
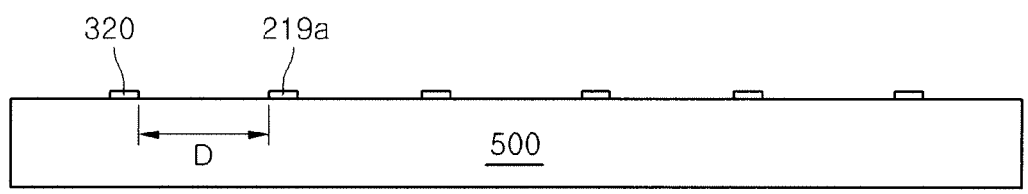
Figure 4B:
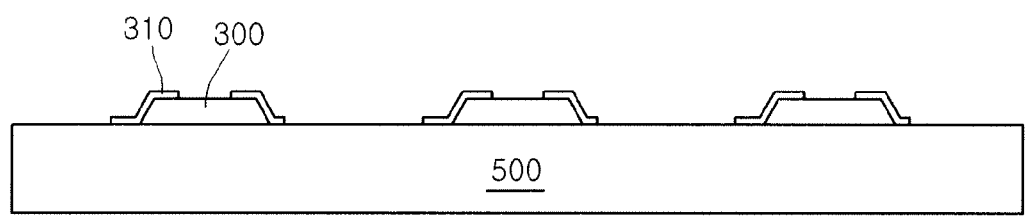
Figure 4B:
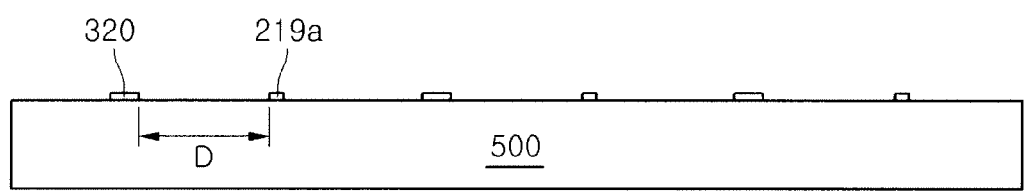
Figure 4C:
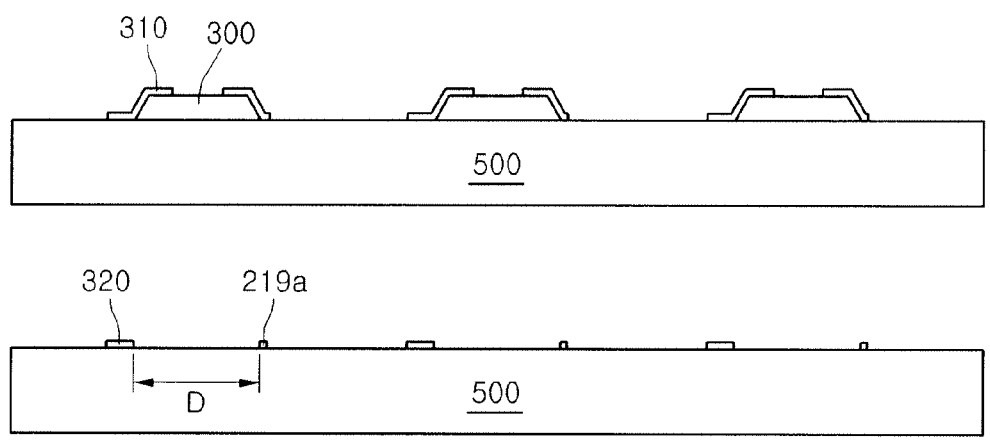

FIGS. 4A-4C are cross-section views for explaining a state in which electrodes formed according to the embodiment of FIGS. 3A-3E are maintained at a constant interval. Referring to FIGS. 4A-4C, after forming a metal film on a substrate 500, a sacrifice layer pattern 300 is formed to perform a mask process. A transparent conductive material is formed on the substrate 500 where the sacrifice layer pattern 300 is formed, and patterned according to the mask process.

When an electrode pattern 310 is formed at the both side edges of the sacrifice layer pattern 300, the sacrifice layer pattern 300 is removed by performing a lift-off process and thus a common electrode 320 and a pixel electrode 219a are formed. When the electrode pattern 310 is formed to overlap the both side edges of the sacrifice layer pattern 300 without misalignment, as illustrated in FIG. 4A, the widths of the common electrode 320 and the pixel electrode 219a have the same value. Also, the distance between the common electrode 320 and the pixel electrode 219a is the same distance D as the width of the sacrifice layer pattern 300.

When the areas overlapping the both side edges of the sacrifice layer pattern 300 due to misalignment generated when the electrode pattern 310 is formed on the sacrifice layer pattern 300 are different from each other as illustrated in FIGS. 4B and 4C, the common electrode 320 and the pixel electrode 219a having different widths are formed. However, both of the common electrode 320 and the pixel electrode 219a maintain the distance D that is the same as the width of the sacrifice layer pattern 300.

Thus, although the widths of the common electrode 320 and the pixel electrode 219a may be different from each other, the distance between the electrodes may be maintained constant. As a result, a brightness defect that may be generated due to the different distance between electrodes in a pixel region may be removed.

That is, when the common electrode 320 and the pixel electrode 219a are alternately arranged having different distances in the pixel region, the intensity of an electric field generated between the common electrode 320 and the pixel electrode 219a varies so that brightness irregularity is generated.

In other words, the brightness irregularity phenomenon may be prevented by maintaining the distance between common electrode 320 and the pixel electrode 219a constant. In the present embodiment, at any event, the distance between common electrode 320 and the pixel electrode 219a is the same as the width D so that the brightness irregularity phenomenon may be minimized.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a liquid crystal display device, the method comprising:
    forming a plurality of sacrifice layer patterns in a pixel region while forming a gate line, a first storage electrode, and a gate pad on a substrate;
    sequentially forming a gate insulation film, an active layer consisting of an amorphous silicon film, an impurity-doped amorphous silicon film, a source meta and a drain metal film on a substrate provided with the gate line, and then forming a source electrode, a drain electrode, an active layer, and a data line;
    forming a protection film on an entire surface of the substrate loaded with the source electrode and drain electrode, and then forming contact holes in the protection film;
    forming a transparent conductive material on the substrate covered with the protection film and then patterning the transparent conductive material, to form a second storage electrode to overlap the first storage electrode and an electrode pattern having a part overlapping an area of an upper side edge of the sacrifice layer patterns and the other part formed on the substrate;
    simultaneously forming a common electrode and a pixel electrode in the pixel region by performing a lift-off process to remove the sacrifice layer patterns on the substrate where the electrode pattern is formed; and
    wherein the lift-off process comprises a process of removing the sacrifice layer patterns and the part of the electrode pattern overlapping the sacrifice layer patterns by using an etchant suitable to etch only the sacrifice layer patterns of the sacrifice layer patterns and electrode pattern.

2. The method claimed as claim 1, wherein the width of each of the common electrode and the pixel electrode in the pixel region formed by the lift-off process is smaller than that of the electrode pattern.

3. The method claimed as claim 1, wherein the width of each of the common electrode and the pixel electrode in the pixel region formed by the lift-off process is the same as that of a part formed on the substrate where the electrode pattern does not overlap the sacrifice layer patterns.

4. The method claimed as claim 1, wherein the part of the electrode pattern overlapping the sacrifice layer pattern is removed together.

* * * * *